United States Patent [19]

Chang

[11] Patent Number: 6,091,638
[45] Date of Patent: Jul. 18, 2000

[54] METHOD FOR PROGRAMMING, READING AND ERASING A FLASH MEMORY

[75] Inventor: Kuang-Yeh Chang, Taipei, Taiwan

[73] Assignee: United Microelectronics Corp., Hsinchu, Taiwan

[21] Appl. No.: 09/220,568

[22] Filed: Dec. 23, 1998

[51] Int. Cl.$^7$ .................................................... G11C 11/34
[52] U.S. Cl. .................................. 365/185.22; 365/185.33
[58] Field of Search .......................... 365/185.28, 185.33, 365/185.22

[56] References Cited

U.S. PATENT DOCUMENTS

| | | | |
|---|---|---|---|
| 5,856,943 | 1/1999 | Jeng | 365/185.14 |
| 5,923,589 | 7/1999 | Kaida et al. | 365/185.28 |

*Primary Examiner*—David Nelms
*Assistant Examiner*—M. Tran
*Attorney, Agent, or Firm*—Thomas, Kayden, Horstemeyer & Risley

[57] ABSTRACT

A method for programming, reading and erasing data stored in a non-volatile memory, a flashing memory in particular, includes applying different voltages on individual components of a flash memory. The flash memory physically consists of a substrate, and a tunneling oxide layer, a floating gate, a dielectric layer and a control gate formed on the substrate in sequence, wherein the substrate also contains a source region and a drain region. A conformed dielectric layer and a selective gate further cover the forgoing structure. By applying properly selected voltages on the substrate, the source region, the drain region, the control gate and the selective gate, the method is capable of preventing the drawbacks of a conventional method on programming, reading and erasing data stored in a flash memory, and improving the process efficiency.

20 Claims, 5 Drawing Sheets

൬,091,638

METHOD FOR PROGRAMMING, READING AND ERASING A FLASH MEMORY

BACKGROUND OF THE INVENTION

1. Field of the Invention

This invention relates to a method for programming, reading and erasing a memory, and more particularly, to a method for programming, reading and erasing a flash memory.

2. Description of Related Art

A non-volatile memory is a data storage device that allows the data stored thereon to be modified and erased, and the data reside on the memory with or without supplied power. The non-volatile memory, including the flash memory developed by Intel, uses a floating gate of a metal-oxide-semiconductor (MOS) transistor within each of the memory cells to store a bit of binary data, a '0' or a '1'. The MOS transistor normally consists of physical components including source/drain regions, a floating gate, a control gate and a tunneling oxide layer.

The method for storing a bit of binary data to a non-volatile memory or erasing a bit of binary data from a non-volatile memory is based on the tunneling effect caused by hot electrons, excited electrons. While a bit of binary data is written to a memory cell, a positive voltage is applied on the drain region as the source region is normally grounded. In addition, another positive voltage is applied on the control gate to force the hot electrons, flowing to ward the drain region from the source region, to pass the tunneling oxide layer and to be injected into the floating gate. Once the hot electrons get in the floating gate, they are trapped by the high energy-barrier material surrounding the floating gate, and reside therein. Since the hot electrons pass through a portion the tunneling oxide layer next to the drain region, the forgoing method is also named as drain side injection (DSI) method.

While the stored binary data is a subject to be erased, the trapped hot electrons are forced to flow outward the floating gate and pass through the tunneling oxide layer by applying a positive voltage on the source region and a negative voltage on the control gate.

A conventional flash memory is illustrated in FIGS. 1 through 4, wherein FIG. 1 shows the layout conventional flash memory, FIG. 2 shows its schematic circuit diagram and FIGS. 3 and 4 show the structural cross-sectional views of the conventional flash memory viewed from different view points, the I—I plane and the II—II plane.

As shown in FIG. 3, a cross-sectional view of plane I—I showing the structure of a conventional flash memory shown in FIG. 1, a transistor consists of source/drain regions 101 and 102, a tunneling oxide layer, a floating gate 105 and a control gate 107.

Referring to FIG. 3 together with FIGS. 2 and 4, A P-type substrate 100 and a N-type source region 101 are both grounded through a wire SL. A N-type drain region 102 is connected to a positive voltage source of about 6 to 8 volts through a contact 109 and a bit line 110, that is, BL1 or BL2 shown in FIG. 2. The control gate 107 is connected to a positive voltage source of about 12 to 16 volts through a word line WL1, WL2, or WL3 shown in FIG. 2. Because of the voltage potential difference between the source region 101 and the drain region 102, hot electrons are then flow from the source region 101 toward the drain region 102 through a N-channel 103. Among the hot electrons flowing toward the drain region, some of them are collected and guided to the ground by the drain region 102. Most hot electrons pass through the tunneling oxide layer 104 and are injected into the floating gate 105 by the attraction of the electric field generated the positive voltage applied on the control gate 107. Once the hot electrons get in the floating gate 105, they are trapped by the high energy-barrier material, oxide 104, dielectric 106 and 108, surrounding the floating gate 105, and reside therein. Once a certain number of hot electrons are trapped within the floating gate, which means a bit of binary data is written to the memory. The required current for the foregoing programming process is about 500 $\mu$A.

While the binary data stored in a memory cell is a subject to be read, a positive voltage of about 5 volts is applied on the control gate 107 through the word line, WL1, WL2 or WL3 in FIG. 2. A positive voltage of about 1.5 volts is applied on the drain region 102 through the bit line BL1 or BL2. The substrate 100 and the source region 101 are still grounded by the source line SL. If there are trapped electrons within the floating gate 105, there are no electrons are flowing form the source region 101 toward the drain region 102. Therefore, a pre-defined '1' or '0' is read. Otherwise, a pre-defined '0' or '1' is read if there are no electrons trapped inside the floating gate 105. The foregoing reading process obtains a current signal of about 70 $\mu$A while the floating gate 105 contains trapped electrons.

For erasing a bit of binary data stored in a memory cell of a flash memory, a negative voltage of about 10 to 15 volts in amplitude is applied on the control gate 107 through the word line WL1, WL2 or WL3. A positive voltage of about 5 volts is applied on the drain region 102. The substrate 100 and the source region 101 are still grounded. The voltage difference between the substrate and the control gate generates an electric field that forces the electrons trapped within the floating gate 105 to pass through the tunneling oxide layer 104, and flow toward the drain region.

Since the conventional DSI method for programming a flash memory requires a pretty high voltage in order to have a sufficient current, The high voltage tends toward degrading the reliability of the flash memory.

The current signal, which is about 70 $\mu$A, obtained by using the foregoing reading method is too low, so that the reading efficiency is limited.

In addition, the foregoing erasing process does not only force the trapped electrons to flow out of the floating gate, the process sometimes excessively drains electrons from the floating gate to cause over-erasing. The over-erasing effect further causes the change on the threshold voltage of the N-channel that leads to a erroneous reading in the follow-up reading process.

SUMMARY OF THE INVENTION

It is therefore an objective of the present invention to provide a method for programming a flashing memory to lower the required working voltage and current to improve the reliability of the flash memory.

It is another an objective of the present invention to provide a method for reading data from a flash memory to improving the reading precision.

It is still another objective of the present invention to provide a method for erasing data stored on a flash memory to prevent the over-erasing effect.

In accordance with the foregoing and other objectives of the present invention, the invention provides a method for programming, reading and erasing data stored in a flash memory. By applying a source side injection (SSI) method, the method of the invention is able to program, write data onto, a flash memory by using a working voltage lower then that used by a conventional method, so the reliability of the flash memory is more ensured. The current signal obtained by the reading method of the invention is higher than that obtained by a conventional reading method to speed up the reading efficiency. The method of the invention includes applying a voltage on a selective gate to prevent the over-erasing effect.

The method of the invention is used to program, read and erase data stored in a non-volatile memory, a flashing memory in particular. The flash memory physically consists of a substrate, and a tunneling oxide layer, a floating gate, a dielectric layer and a control gate formed on the substrate in sequence, wherein the substrate also contains a source region and a drain region. A conformed dielectric layer and a selective gate further cover the forgoing structure. By applying properly selected voltages on the substrate, the source region, the drain region, the control gate and the selective gate, the method of the invention is capable of preventing the drawbacks of a conventional method on programming, reading and erasing data stored in a flash memory, and improving the process efficiency.

The method of the invention forces hot electrons to injected into the floating gate through a section of the tunneling oxide layer next to the source region by applying voltage on the selective gate and the control gate. Therefore, the required voltages applied on word lines and bit lines are relatively reduced to improve the programming efficiency and the reliability of the flash memory. By applying a properly selected voltage on the selective gate, the method of the invention is also capable of obtaining a higher read current signal to improve the reading efficiency. In addition, the selective gate is used to prevent the over-erasing effect as well to ensure the functionality of the flash memory.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The invention provides a new method for programming, reading and erasing data stored in a non-volatile memory, a flashing memory particularly.

Figure 1:
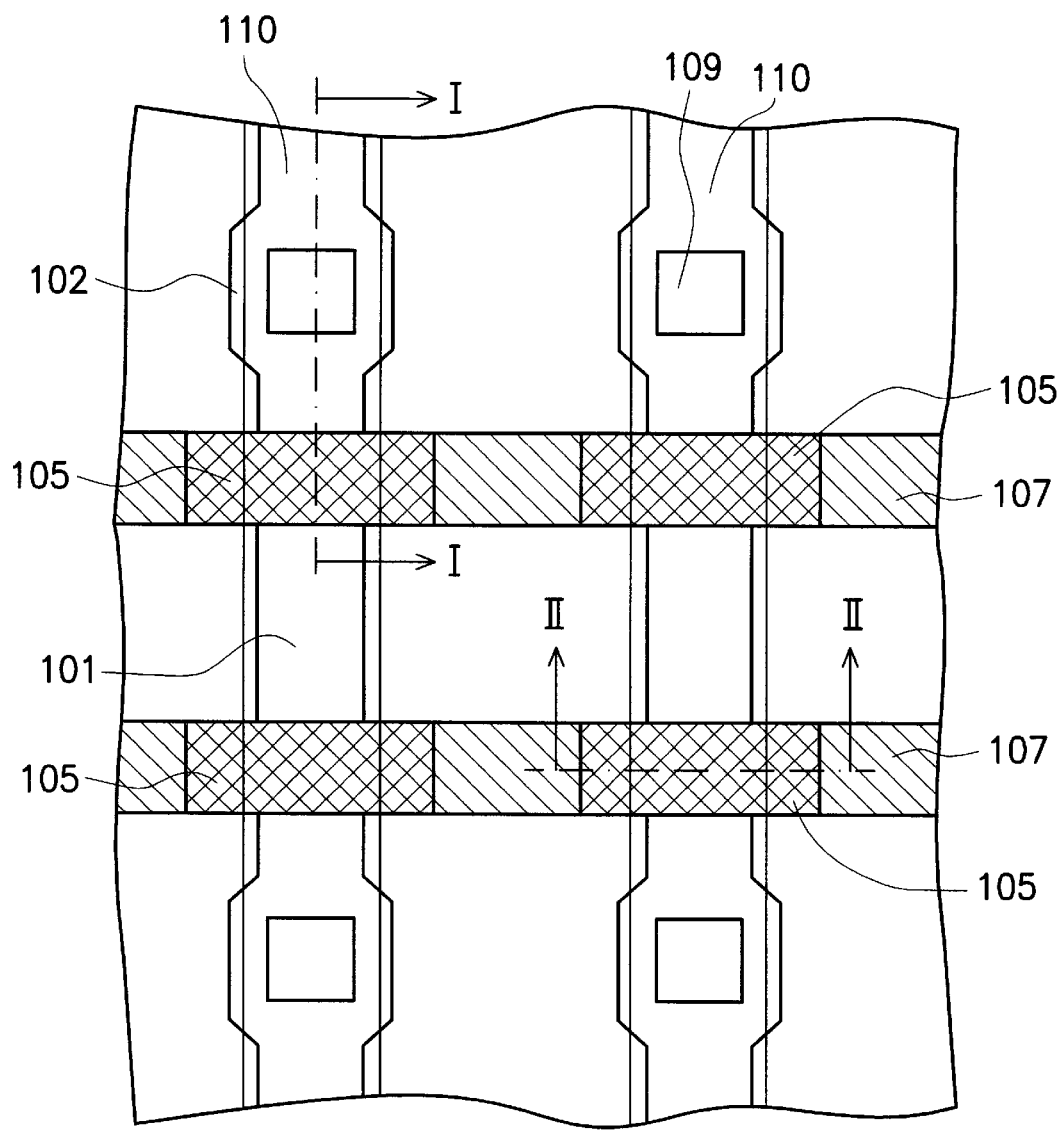
FIG. 1 is a top-viewed schematic diagram showing the layout of a conventional flash memory.
Figure 2:
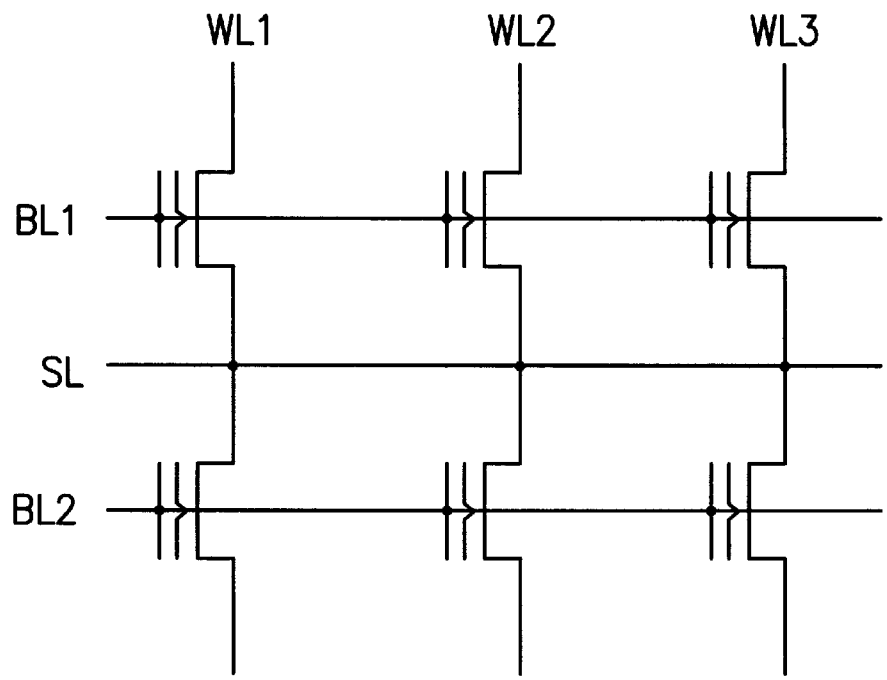
FIG. 2 is a schematic diagram showing the electric circuit of the conventional flash memory shown in FIG. 1.
Figure 3:
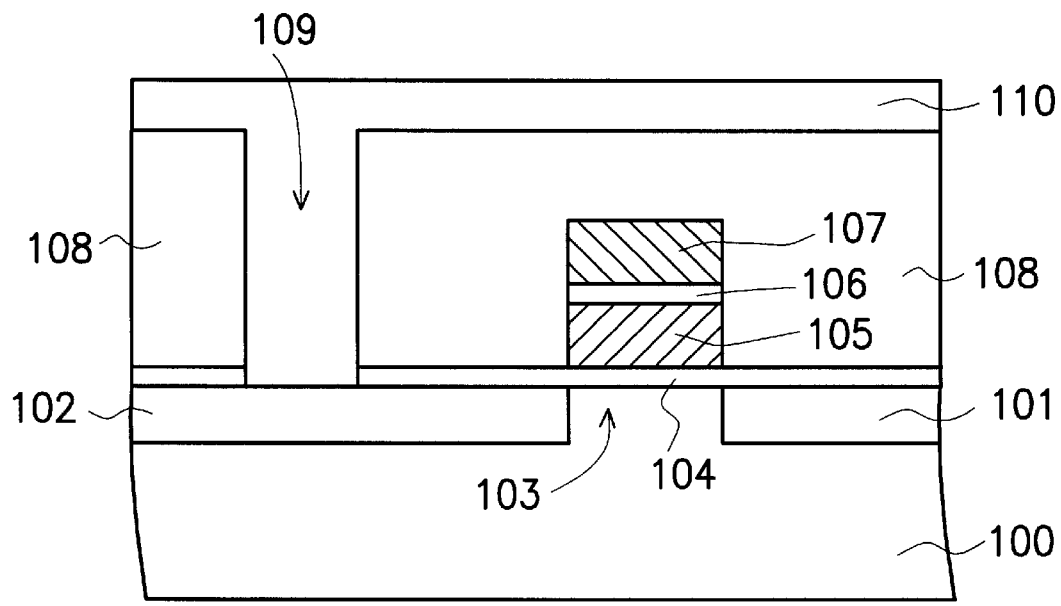
FIG. 3 is a schematic cross-sectional view of the conventional flash memory shown in FIG. 1 along the plane I—I.
Figure 4:
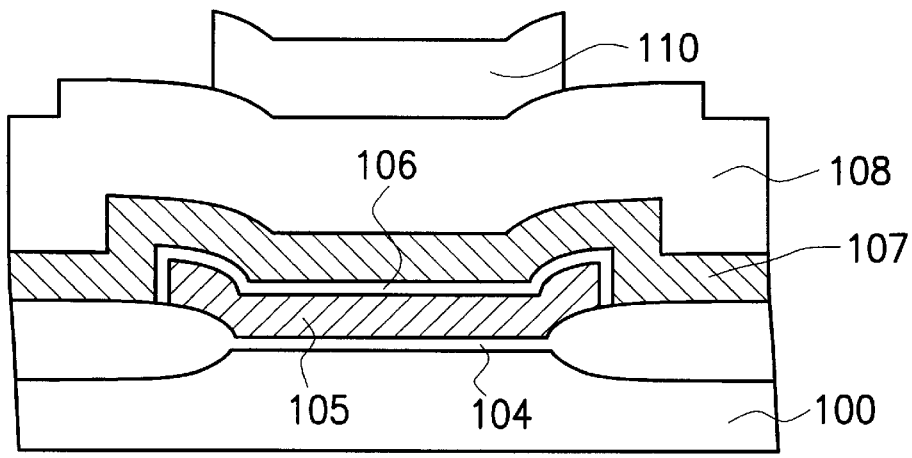
FIG. 4 is a schematic cross-sectional view of the conventional flash memory shown in FIG. 1 along the plane II—II.
Figure 5:
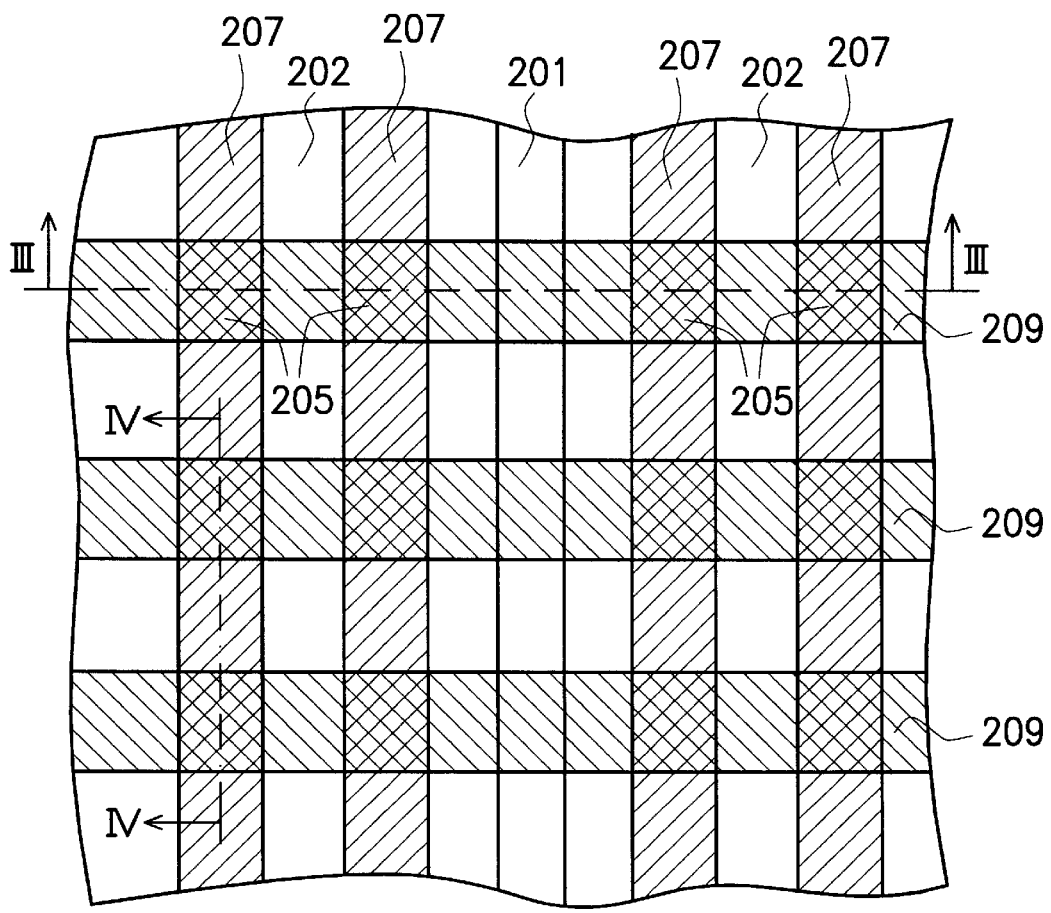
FIG. 5 is a top-viewed schematic diagram showing the layout of a flash memory of a preferred embodiment of the invention.
Figure 6:
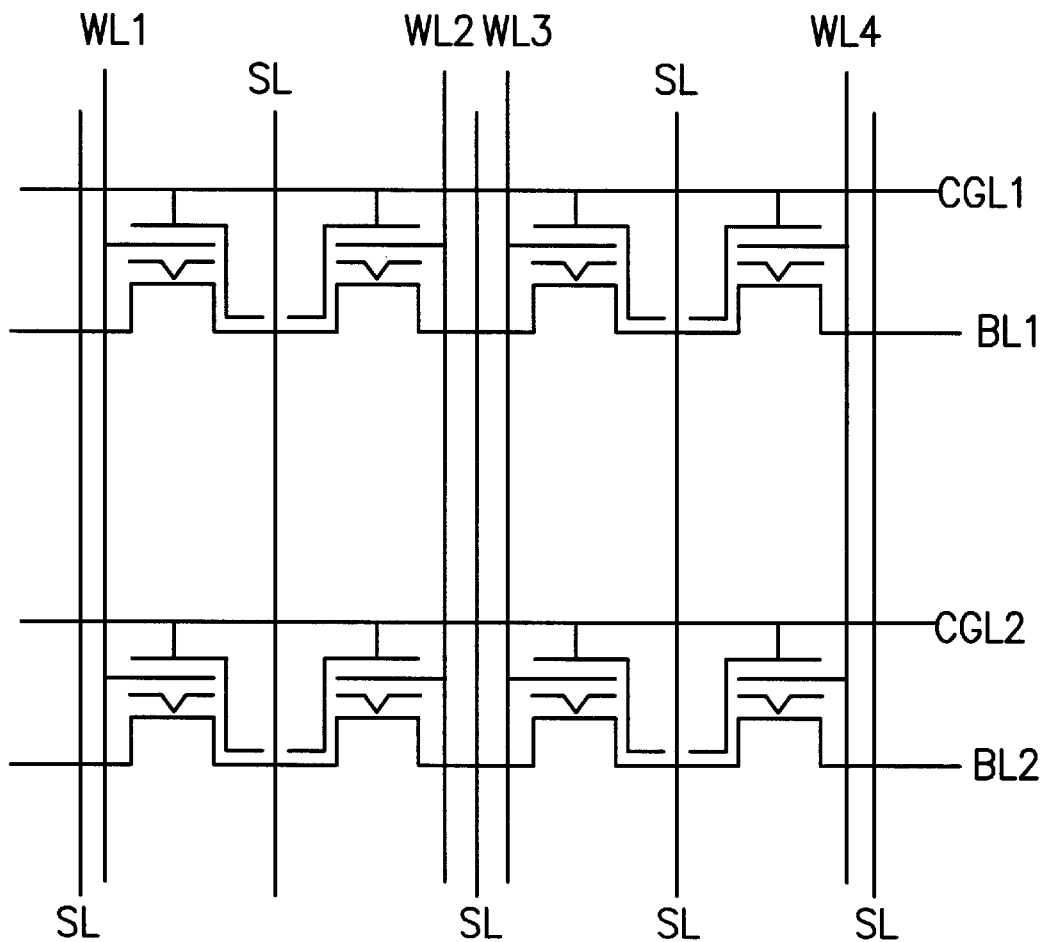
FIG. 6 is a schematic diagram showing the electric circuit of the flash memory of a preferred embodiment of the invention shown in FIG. 5.
Figure 7:
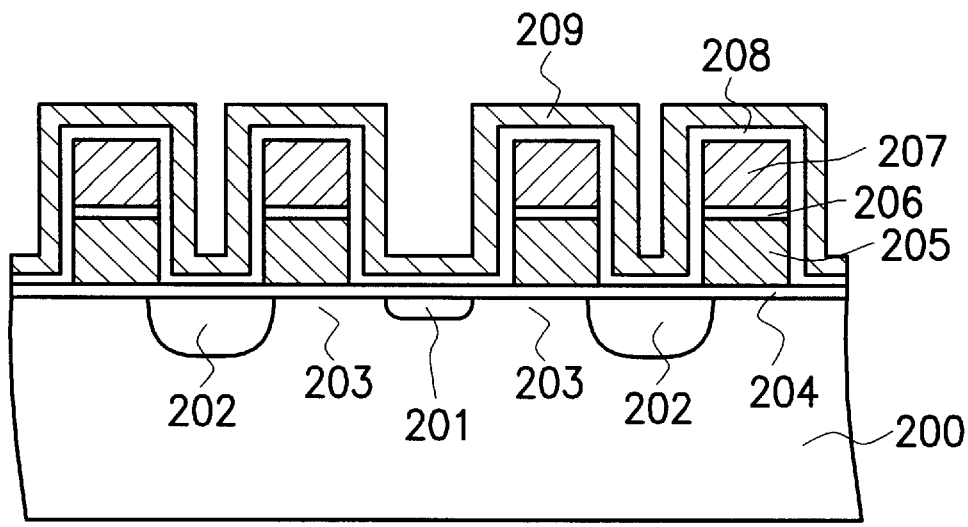
FIG. 7 is a schematic cross-sectional view of the flash memory of a preferred embodiment of the invention shown in FIG. 5 along the plane III—III.
Figure 8:
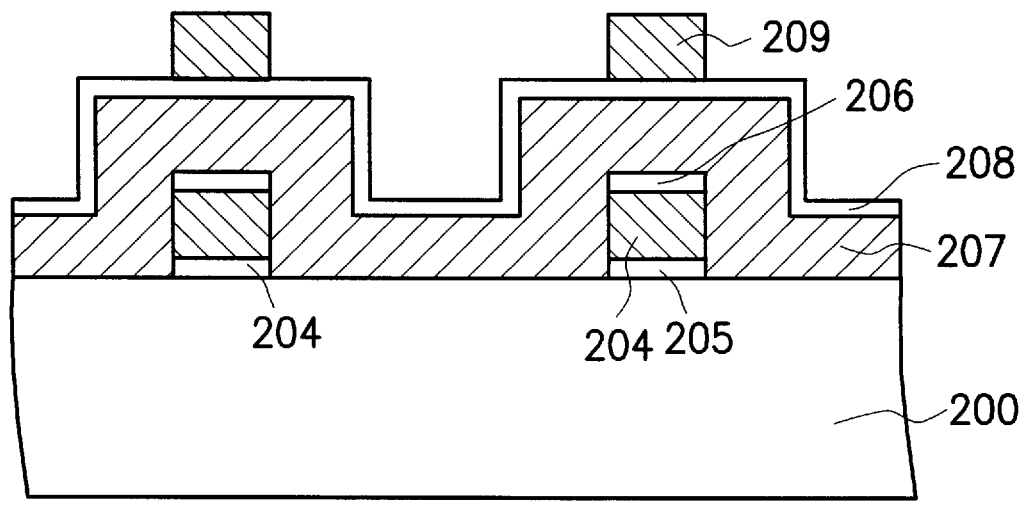
FIG. 8 is a schematic cross-sectional view of the flash memory of a preferred embodiment of the invention shown in FIG. 1 along the plane IV—IV.

FIGS. 5 through 8 show the structure of a preferred flash memory used in an embodiment of the invention. FIG. 7 is a cross-sectional view of the flash memory shown in FIG. 5 viewed from the plane III—III, and FIG. 8 is also a cross-sectional view of the particular flash memory but viewed from the plane IV—IV.

Referring to FIG. 7 together with FIG. 8, the structure of a preferred flashing memory includes a substrate 200, such as a P-type substrate, and a tunneling oxide layer 204, a floating gate 205, a first dielectric layer 206 and a control gate 207 formed on the substrate 200 in sequence. A second dielectric layer 208 and a selective gate 209 conformal to the foregoing devices are formed on the substrate 200 in sequence to cover the foregoing devices. The substrate 200 also contains a first source/drain region 201 as a source region, and a second N-type source/drain region 202 as a drain region, wherein the source/drain regions are N-type if the substrate 200 is P-type.

Referring to FIG. 7 along with FIG. 6, while a bit of binary data is a subject to be written to a memory cell of the flash memory, both the substrate 200 and the source region 201 are grounded through the source line SL. Instead of a voltage of about 12 to 16 volts used conventionally, a lower positive voltage of about 10 to 12 volts is applied on the control gate 207 through a word line, WL1, WL2, WL3 or WL4. Another positive voltage, preferably 5 volts, is applied on the drain region 202 through a bit line, BL1 or BL2. Conventionally, the voltage applied on a drain region is about 6 to 8 volts. The selective gate 209 is connected to a positive voltage through the wire CGL1 or CGL2. The voltage applied on the selective gate 209 is preferably less than half of the voltage applied on the drain region 202, and is set to be about 2 volts as preferred in this embodiment. The voltage difference between the source region 201 and the drain region 202 generates a number of stimulated electrons, hot electrons, flowing along the tunnel 203 between the source region 201 and the drain region 202. Since the voltage level at the drain region 202 is higher than that at the source region 201, the hot electrons are flowing from the source region 201 toward the drain region 202. Affected by the electric field created by the voltages applied on the selective gate 209 and the control gate 207, the hot electrons from the source region 201 are forced to directly pass the tunneling oxide layer 204 and are injected into the floating gate 205. The foregoing process is a so-called source side injection (SSI) method. The hot electrons that charge the floating gate 205 are trapped within the floating gate 205 by the high energy-barrier material, the first dielectric layer 206 and the second dielectric layer 208, surrounding the floating gate 205. Once the floating gate 205 is charged by the hot electrons, the programming process is finished.

The method of the invention for programming a flash memory applies a lower voltage on the control gate 207 in the presence of another voltage of about 2 volts applied on the selective gate 209, the performance of the flash memory is more reliable. The required working current is as low as about 1 μA that is also helpful to ensure the reliability of the flash memory and to improve the programming effieiency.

While a bit of binary data stored in a flash memory is the subject to be read, different voltages are required to be applied on different components of the flash memory. The source region 201 and the substrate 200 are still both grounded through the source line SL. The word line, WL1, WL2, WL3 or WL4, connects the control gate 207 to a voltage, preferably 5 volts. A preferred voltage of about 5 volts is applied on the selective gate 209 through the wire, CGL1 or CGL2, as well. The voltage applied on the drain region is now changed to a preferable value of about 1.5 to 3 volts through the bit line, BL1 or BL2. If there are hot electrons are trapped within the floating gate 205, there are no electrons flowing along the tunnel 103. Therefore, a pre-determined '1' or '0' is obtained. Otherwise, a pre-determined '0' or '1' is obtained if the floating gate 205 is not charged.

The method of the invention for reading data stored in a flash memory obtains a read current signal of about 120 $\mu$A, which is much higher than 70 $\mu$A what is obtained by a conventional method. The reading efficiency is improved.

While a bit of binary data stored in a flash memory is to be erased, the substrate 200 and the source region 201 are still grounded through the source line SL. A preferred negative voltage of about −10 to −12 is applied on the control gate 207 through the word line, WL1, WL2, WL3 or WL4. A preferred positive voltage of about 5 volts is applied on the drain region 202. The trapped hot electrons then pass through the tunneling oxide layer 204 by the repulsion of the negative voltage applied on the control gate 207, and flow toward the drain region 202 by the attraction of the positive voltage applied on the drain region 202. Once the hot electrons are drained from the floating gate 205, the memory cell is erased.

The method of the invention forces hot electrons to injected into the floating gate through a section of the tunneling oxide layer next to the source region by applying voltages on the selective gate and the control gate. Therefore, the required voltages applied on word lines and bit lines are relatively reduced to improve the programming efficiency and the reliability of the flash memory. By applying a properly selected voltage on the selective gate, the method of the invention is also capable of obtaining a higher read current signal to improve the reading efficiency. In addition, the selective gate is used to prevent the over-erasing effect as well to ensure the functionality of the flash memory.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for programming a flash memory formed on a substrate, wherein the flash memory physically comprises a tunneling oxide layer, a floating gate, a first dielectric layer and a control gate in sequence, and wherein the substrate, the tunneling oxide layer, the floating gate, the first dielectric layer and the control gate are covered by a conformed second dielectric layer and a selective gate, and wherein the substrate comprises at least a source region and a drain region, the source region and the drain region are covered by the second dielectric layer and the selected gate, the method comprising:

applying a first voltage to the substrate;

applying a second voltage to the source region, and a third voltage to the region to generate a plurality of electrons flowing between the source region and the drain region, wherein the second voltage is different from the third voltage; and applying a fourth voltage to the control gate, and a fifth voltage to the selective gate, to force the electrons to pass through the tunneling oxide layer, be injected into the floating gate near the source region and stay within the floating gate.

2. The method for programming the flash memory of claim 1, wherein the source region and the drain region are N-type.

3. The method for programming the flash memory of claim 2, wherein the first voltage is grounded.

4. The method for programming the flash memory of claim 3, wherein the second voltage is grounded.

5. The method for programming the flash memory of claim 4, wherein the third voltage includes a positive voltage of about 5 volts.

6. The method for programming the flash memory of claim 3, wherein the fourth voltage includes a positive voltage of about 10 to 12 volts.

7. The method of claim 1, wherein the fifth voltage is less than about half of the third voltage.

8. A method for reading a flash memory formed on a substrate, wherein the flash memory physically comprises a tunneling oxide layer, a floating gate, a first dielectric layer and a control gate in sequence, and wherein the substrate, the tunneling oxide layer, the floating gate, the first dielectric layer and the control gate are covered by a conformed second dielectric layer and a selective gate, and wherein the substrate comprises at least a source region and a drain region, the source region and the drain region are covered by the second dielectric layer and the selected gate, the method comprising:

applying a first voltage to the substrate;

applying a second voltage to the control gate, and a third voltage to the selective gate; and applying a fourth voltage to the source region, and a fifth voltage to the drain region, wherein the fourth voltage and the fifth voltage create a channel in the substrate to connect the source region and the drain region in the case that the floating gate is not charged.

9. The method for reading the flash memory of claim 8, wherein the source region and the drain region are N-type.

10. The method for reading the flash memory of claim 9, wherein the first voltage is grounded.

11. The method for reading the flash memory of claim 10, wherein the fourth voltage is grounded.

12. The method for reading the flash memory of claim 11, wherein the fifth voltage includes a positive voltage of about 1.5 to 3 volts.

13. The method for reading the flash memory of claim 10, wherein the second voltage includes a positive voltage of about 5 volts.

14. A method for erasing a flash memory formed on a substrate, wherein the flash memory physically comprises a tunneling oxide layer, a floating gate, a first dielectric layer and a control gate in sequence, and wherein the substrate, the tunneling oxide layer, the floating gate, the first dielectric layer and the control gate are covered by a conformed second dielectric layer and a selective gate, and wherein the floating gate contains a plurality of electrons, and wherein the substrate comprises at least a source region and a drain region, the source region and the drain region are covered by the second dielectric layer and the selected gate, the method comprising:

applying a first voltage to the substrate; and applying a second voltage to the control gate, and a third voltage to the drain region, wherein the second voltage on the control gate and the third voltage on the drain region generate a electric field that forces the electrons to flow toward the drain region from the floating gate by passing through the tunneling oxide layer.

15. The method for erasing the flash memory of claim 14, wherein the source region and the drain region are N-type.

16. The method for erasing the flash memory of claim 15, wherein the first voltage is grounded.

17. The method for erasing the flash memory of claim 16, wherein the second voltage includes a negative voltage of about −10 to −12 volts.

18. The method for erasing the flash memory of claim 16, wherein the third voltage includes a positive voltage of about 5 volts.

19. A method for programming a flash memory formed on a substrate, wherein the flash memory physically comprises a tunneling oxide layer, a floating gate, a first dielectric layer and a control gate in sequence, and wherein the tunneling oxide layer, the floating gate, the first dielectric layer and the control gate are covered by a conformed second dielectric layer and a selective gate, and wherein the substrate comprises at least a first N-type source/drain region and a second N-type source/drain region, the method comprising:

applying a first voltage to the substrate, wherein the first voltage is grounded;

applying a second voltage to the first N-type source/drain region, and a third voltage to the second N-type source/drain region to generate a plurality of electrons flowing between the first N-type source/drain region and the second N-type source/drain region, wherein the second voltage is grounded and the third voltage is a positive voltage of about 5 volts; and applying a fourth voltage to the control gate, and a fifth voltage to the selective gate, to force the electrons to pass through the tunneling oxide layer, be injected into the floating gate and stay within the floating gate, wherein the fifth voltage is a positive voltage of about 2 voltage.

20. A method for reading a flash memory formed on a substrate, wherein the flash memory physically comprises a tunneling oxide layer, a floating gate, a first dielectric layer and a control gate in sequence, and wherein the tunneling oxide layer, the floating gate, the first dielectric layer and the control gate are covered by a conformed second dielectric layer and a selective gate, and wherein the substrate comprises at least a N-type first source/drain region and a second N-type source/drain region, the method comprising:

applying a first voltage to the substrate, wherein the first voltage is grounded;

applying a second voltage to the control gate, and a third voltage to the selective gate, wherein the third voltage is a positive voltage of about 5 volts; and applying a fourth voltage to the first N-type source/drain region, and a fifth voltage to the second N-type source/drain region, wherein the fourth voltage and the fifth voltage create a channel in the substrate to connect the first N-type source/drain region and the second N-type source/drain region in the case that the floating gate is not charged.

* * * * *